(12) United States Patent
Goodrich, III et al.

(10) Patent No.: US 7,089,441 B2
(45) Date of Patent: Aug. 8, 2006

(54) CLOCK MULTIPLIER SELECTION FOR A MICROPROCESSOR WITH MULTIPLE SYSTEM BUS CLOCKING FREQUENCIES

(75) Inventors: Floyd Goodrich, III, Portland, OR (US); Shannon J. Poulin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 637 days.

(21) Appl. No.: 09/795,733

(22) Filed: Feb. 27, 2001

(65) Prior Publication Data

US 2002/0162042 A1 Oct. 31, 2002

(51) Int. Cl.
*G06F 1/04* (2006.01)
*H04L 7/00* (2006.01)

(52) U.S. Cl. .................. 713/500; 710/305
(58) Field of Classification Search ........... 713/500; 710/305
See application file for complete search history.

(56) References Cited

U.S. PATENT DOCUMENTS 5,142,247 A * 8/1992 Lada et al. .............. 331/14
5,719,510 A * 2/1998 Weidner ................. 327/119
5,740,411 A * 4/1998 Hearn et al. ............. 713/503
5,784,599 A * 7/1998 Elkhoury ................. 713/501
5,894,232 A * 4/1999 Duley ..................... 327/48
5,964,883 A * 10/1999 Hewitt .................... 713/503
5,991,844 A * 11/1999 Khosrowpour .......... 710/312
6,138,232 A * 10/2000 Shiell et al. ............. 712/244
6,161,188 A * 12/2000 Gaskins et al. .......... 713/501
6,212,482 B1* 4/2001 Manning ................. 702/182
6,385,735 B1* 5/2002 Wilson et al. ........... 713/501
6,487,656 B1* 11/2002 Kim et al. ............... 713/2
6,535,988 B1* 3/2003 Poisner .................. 713/500

FOREIGN PATENT DOCUMENTS

JP          10289032 A  * 10/1998

* cited by examiner

*Primary Examiner*—A. Elamin
*Assistant Examiner*—Eric Chang
(74) *Attorney, Agent, or Firm*—Blakely, Sokoloff, Taylor & Zafman LLP

(57) ABSTRACT

Clock multiplier selection methods and apparatuses. One embodiment includes a clock interface to receive a clock signal, a frequency detect circuit, and a multiplier selection circuit. The frequency detect circuit detects an operating frequency of the clock signal and the multiplier selection circuit selects a clock multiplier that is a function of the operating frequency of the clock signal.

24 Claims, 7 Drawing Sheets

CLOCK MULTIPLIER SELECTION FOR A MICROPROCESSOR WITH MULTIPLE SYSTEM BUS CLOCKING FREQUENCIES

BACKGROUND

1. Field

The present disclosure pertains to the field of electronic components. More particularly, the present disclosure pertains to selecting the ratio of an internal clock to another clock such as an external clock that is provided to an electronic component.

2. Description of Related Art

Integrated circuits and other electronic components are generally designed to operate within certain parameters. One important parameter usually specified for an electronic component is a maximum operating frequency. Typically, manufacturers can only ensure the component performs specified operations reliably as long as the user operates the component at or below the maximum operating frequency. Thus, manufacturers of electronic components would like to ensure that their parts are operated at or below the maximum operating frequency.

Unfortunately, there is a significant faction of computer users that engages in "over-clocking" of components such as processors. Over-clocking involves providing the component with a clock signal having a higher frequency than the component is designed to use. Typically, this external clock is multiplied by a predetermined multiplier to provide one or more higher frequency clocks for internal operations of the component. Alternatively, over-clocking may be accomplished in some cases by altering the predetermined multiplier so that internal operations of the component are performed at a higher multiple of the frequency of the external clock than originally intended.

Some processors allow the clock multiplier to be set by adjusting motherboard connections, software, or firmware. Other processors have their clock multipliers programmed during manufacturing by blowing out fuses, so that the clock multiplier may not be tampered with by unauthorized persons. Thus, in prior art schemes, the clock multiplier is fixed and is not adjusted or tested based on the frequency of the clock provided to the component.

An over-clocked component performs operations more rapidly and thus the user is "rewarded" with better performance. The downside of over-clocking is that logic malfunctions are more likely, and the part may be damaged or destroyed (e.g., due to overheating). Since manufacturers often conservatively specify maximum operating conditions, however, slightly over-clocked parts may operate fairly well despite the over-clocking.

Thus, over-clocking is fairly popular. Unfortunately, such over-clocking reduces the market for high-end or faster parts because over-clockers purchase lower speed parts and over-clock them to achieve the desired performance level. The sale of the lower speed parts is typically significantly less lucrative for component manufacturers.

A more nefarious problem is the combination of remarking and over-clocking. Some components illegally have their labeling altered to indicate that they are capable of operating at a higher speed. These remarked products may then be resold at a higher price because of the better performance associated with the higher frequency operation. Often, faster parts command significant premiums over their slower brethren, making remarking and over-clocking a lucrative (albeit illegal) endeavor. Moreover, remarking and over-clocking are difficult problems to address since both may be hard to detect and may occur in jurisdictions where enforcement of appropriate laws is difficult.

BRIEF DESCRIPTION OF THE FIGURES

The present invention is illustrated by way of example and not limitation in the Figures of the accompanying drawings.

DETAILED DESCRIPTION

The following description provides clock multiplier selection for a microprocessor with multiple system bus clocking frequencies. In the following description, numerous specific details such as logic implementations, sizes and names of clock multipliers, types and interrelationships of system components, and logic partitioning/integration choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement appropriate logic circuits without undue experimentation. While one embodiment is directed to a microprocessor with multiple system bus clocking frequencies, the techniques described may more generally be applied to other types of electronic components that have internal clocks operating at different frequencies than other clocks.

Some embodiments of disclosed techniques detect a frequency of an external clock provided to a component and select an appropriate clock multiplier based on the measured frequency. Thus, in some embodiments, disclosed clock multiplier selection techniques may advantageously prevent a component from being over-clocked or operated at frequency which the manufacturer did not intend the component be operated.

Figure 1:
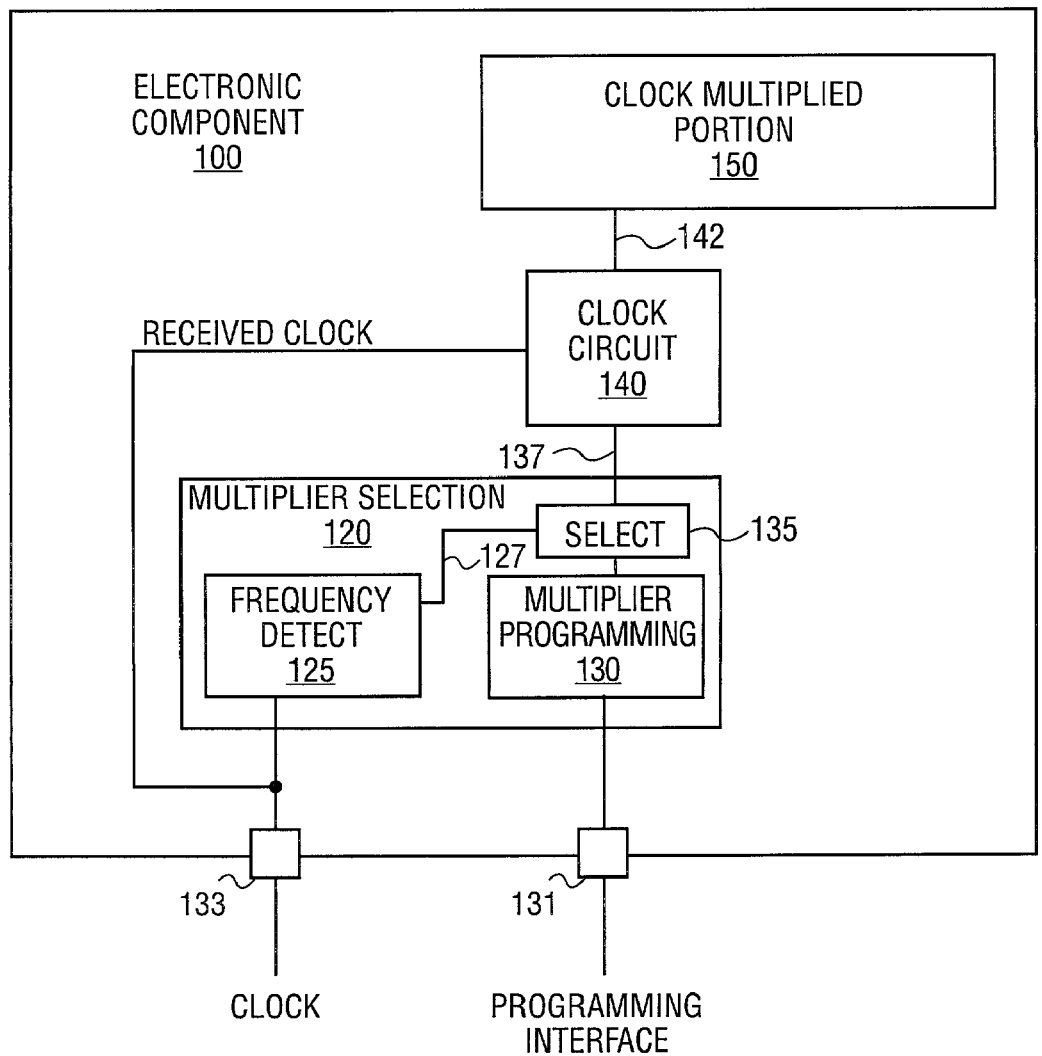
FIG. 1 illustrates a component having one embodiment of clock multiplier selection circuitry.

FIG. 1 illustrates an electronic component 100 having one embodiment of a clock multiplier selection circuit 120. The component 100 in the embodiment of FIG. 1 also includes a clock multiplied portion 150 and a clock interface 133 to provide a clock signal to a clock circuit 140. The clock interface 133 may be a pin interface, a ball interface, or any other type of known or otherwise available interface that may be used to connect an electronic component to receive external signals. Alternatively, in some embodiments, the clock interface 133 may occur within a single electronic component and therefore may be as little as the connection of a conductor or other signaling interface (e.g., electrical, optical, etc.).

The clock circuit 140 provides an internal clock signal to the clock multiplied portion 150 that has a frequency relationship with respect to the received clock defined by the multiplier selection circuit 120. In particular, the multiplier selection circuit 120 provides a clock multiplier on signal lines 137 to the clock circuit 140, and the clock circuit 140 generates the appropriate internal clock on signal line(s) 142. The clock circuit 140 may be a phase locked loop, a delay locked loop, or any of various known or otherwise available clock circuits that are capable of adjusting or developing an output clock a different frequency than an input clock.

Typically, the internal clock generated for the clock multiplied portion 150 operates at a higher frequency than the clock received by the component 100. However, the clock circuit 140 may produce a higher or lower frequency internal clock. Additionally, the clock circuit 140 may produce an internal clock signal with a frequency that has an integral relationship with the received clock frequency or may produce an internal clock signal that has a fractional or other (i.e., irrational number multiplier) to the received clock frequency.

The embodiment of the multiplier selection circuit 120 shown in FIG. 1 includes a frequency detect circuit 125, a multiplier programming circuit 130, and a select circuit 135. The frequency detect circuit 125 measures an operating frequency of the received clock. In some embodiments, the frequency detect circuit 125 performs a fine-grained measurement of the operating frequency and determines a fairly specific digital value corresponding to the operating frequency. For example, the frequency detect circuit 125 in some embodiments may use 4, 8, 16, 32, 64, or more bits to represent the frequency. In some embodiments, it may be assumed that the operating frequency will fall within a predetermined range which is smaller than the range from zero to the maximum operating frequency. Thus, the bits used may focus on narrowing down an estimate of the operating frequency within a particular range of frequencies, thereby providing better frequency granularity.

Various frequency counting and detection circuits are known in the art. For example, a frequency counter may be used to perform such fine-grained frequency detection if such detection is desired. Other known or otherwise available circuitry such as phase locked loops, delay locked loops, and other generally known frequency detection or estimation techniques may be used. The precise type of circuitry employed and its operational characteristics are not critical to the present invention.

In other embodiments, the frequency detect circuit 125 may perform a more rudimentary type of frequency detection. For example, the frequency detect circuit may only discern between two, three, four, or another relatively small number (e.g., 16 or less) of frequencies. For example, the frequency detect circuit 125 may distinguish which of two bus operating frequencies is being supplied to a microprocessor. In embodiments that only distinguish such small number of frequencies, simpler and more compact coarse frequency determination circuitry may be used for the frequency detect circuit 125.

In either case, the frequency detect circuit 125 provides an indication of a measured frequency to the select circuit 135 on one or more signal lines 127. The select circuit 135 is coupled to the multiplier programming circuit 130. The multiplier programming circuit 130 is so named because a value programmed into the multiplier programming circuit 130 can change which clock multiplier is provided to the clock circuit 140. For example, an integrated circuit manufacturer may program one or more bits indicating a maximum or desired operating frequency or one or more multipliers that may be used to obtain that frequency after the operating frequency has been tested. The select circuit 135 selects an appropriate set of bits to provide a clock multiplier to the clock circuit 140 to achieve the desired operating frequency indicated by the multiplier programming circuit 130. The select circuit 135 makes its selection based on the operating frequency of the received clock, which is provided to the select circuit 135 by the frequency detect circuit 125, in conjunction with the desired frequency programming by the manufacturer. In one embodiment, the select circuit 135 is a multiplexer that selects between a limited number of clock multipliers programmed into the multiplier programming circuit 130.

Thus, the frequency of the received clock frequency determines the clock multiplier used and ultimately the internal clock frequency. Clock multiplier selection techniques that determine the clock multiplier as a function of the clock frequency of the clock signal that is actually received may advantageously adjust the clock multiplier to avoid over-clocking the internal portions of the component. Such techniques may advantageously simplify system and/or chip level design and/or manufacturing by allowing a component to adapt to the frequency provided to it. These techniques may also advantageously defeat, deter, and/or limit the ability of one who seeks to over-clock components.

A programming interface 131 may be available only to the manufacturer in some embodiments. For example, the programming interface 131 may be one or more contacts on the component which are not externally available once packaging and/or assembly of the component is complete. Alternatively, the programming interface 131 may be externally accessible and/or may be a program-once circuit such that the desired operating frequency may not be easily overridden. Additionally, in some embodiments, it may be desirable to have a bypass mode for test and/or debug purposes.

Figure 2:
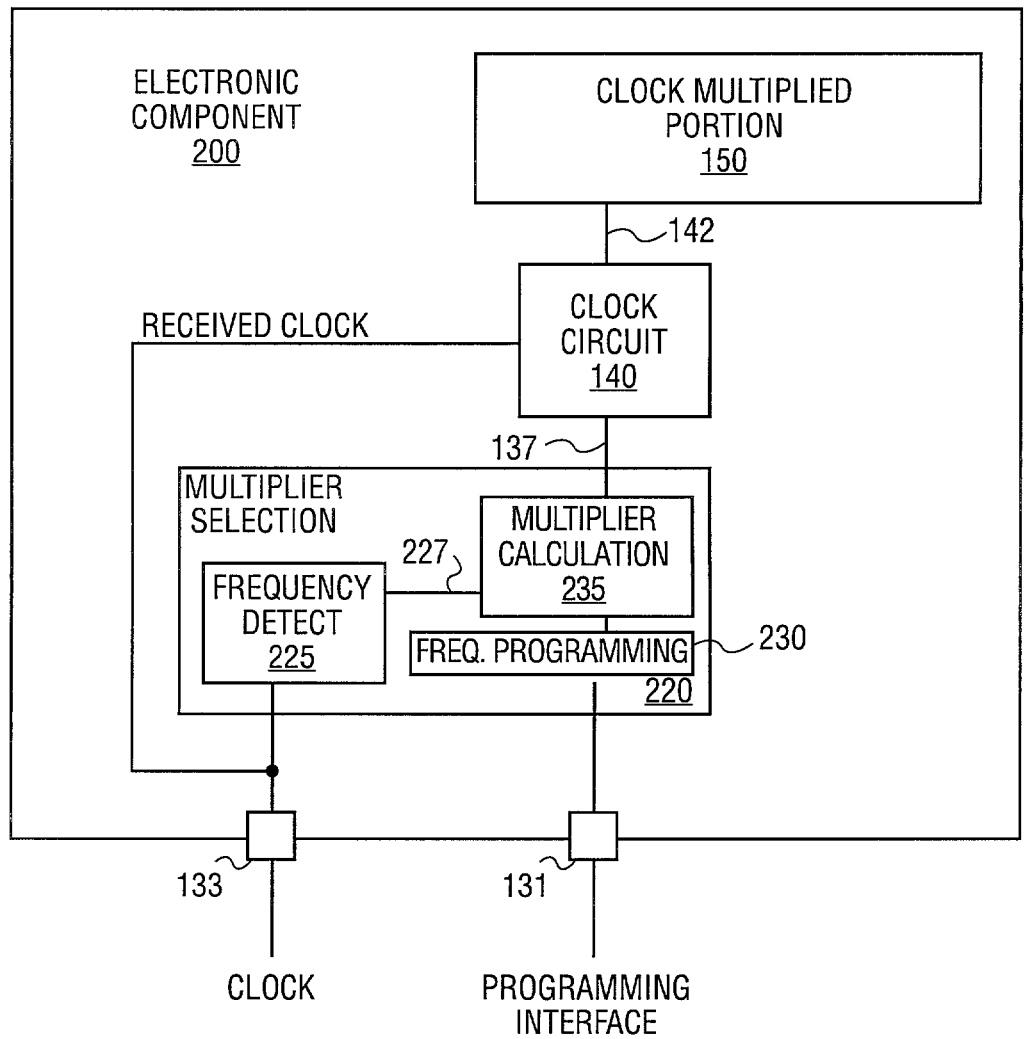
FIG. 2 illustrates a component having another embodiment of clock multiplier selection circuitry.

FIG. 2 illustrates a component 200 having another embodiment of a multiplier selection circuit 220. The component 200 of FIG. 2 also includes a clock circuit 140 and a clock multiplied portion 150 as discussed with respect to FIG. 1. Also, as discussed with respect to FIG. 1, the clock circuit 140 receives a clock multiplier on one or more signal lines 137 and generates an appropriate internal clock for the clock multiplied portion 150.

The multiplier selection circuit of FIG. 2 again includes a frequency detect circuit 225. In this embodiment, the frequency detect circuit 225 provides an indication of a measured frequency on signal lines 227 to a multiplier calculation circuit 235. A frequency programming circuit 230 is coupled to be programmed by the programming interface. The frequency programming circuit 230 is programmed to indicate a desired operating frequency.

Instead of programming several possible clock multipliers as may be done in some embodiments of FIG. 1, the embodiment of FIG. 2 may simply be programmed with the desired frequency. The multiplier calculation circuit 235 itself calculates appropriate multipliers for any received clock frequency depending on the desired internal clock operating frequency. The multiplier calculation circuit 235 determines an appropriate multiplier of the measured frequency from the signal lines 227 that achieves or approximates the desired operating frequency programmed into the frequency programming circuit 230. Known or otherwise available logic techniques may be applied to provide a circuit that performs the appropriate calculation.

Thus, a more flexible approach may be achieved by providing circuitry to perform clock multiplier calculation. Depending on the number of bits used to represent the measured frequency as well as the precision of the desired operating frequency programmed into the frequency programming circuit 230, the multiplier calculation circuit 235 may be unable to provide a multiplier that exactly multiplies the received clock frequency to achieve the desired operating frequency. In such cases, the multiplier calculation circuit 235 may be configured to choose a slightly lower operating frequency to avoid operating the clock multiplied portion 150 above a maximum acceptable operating frequency.

Figure 3:
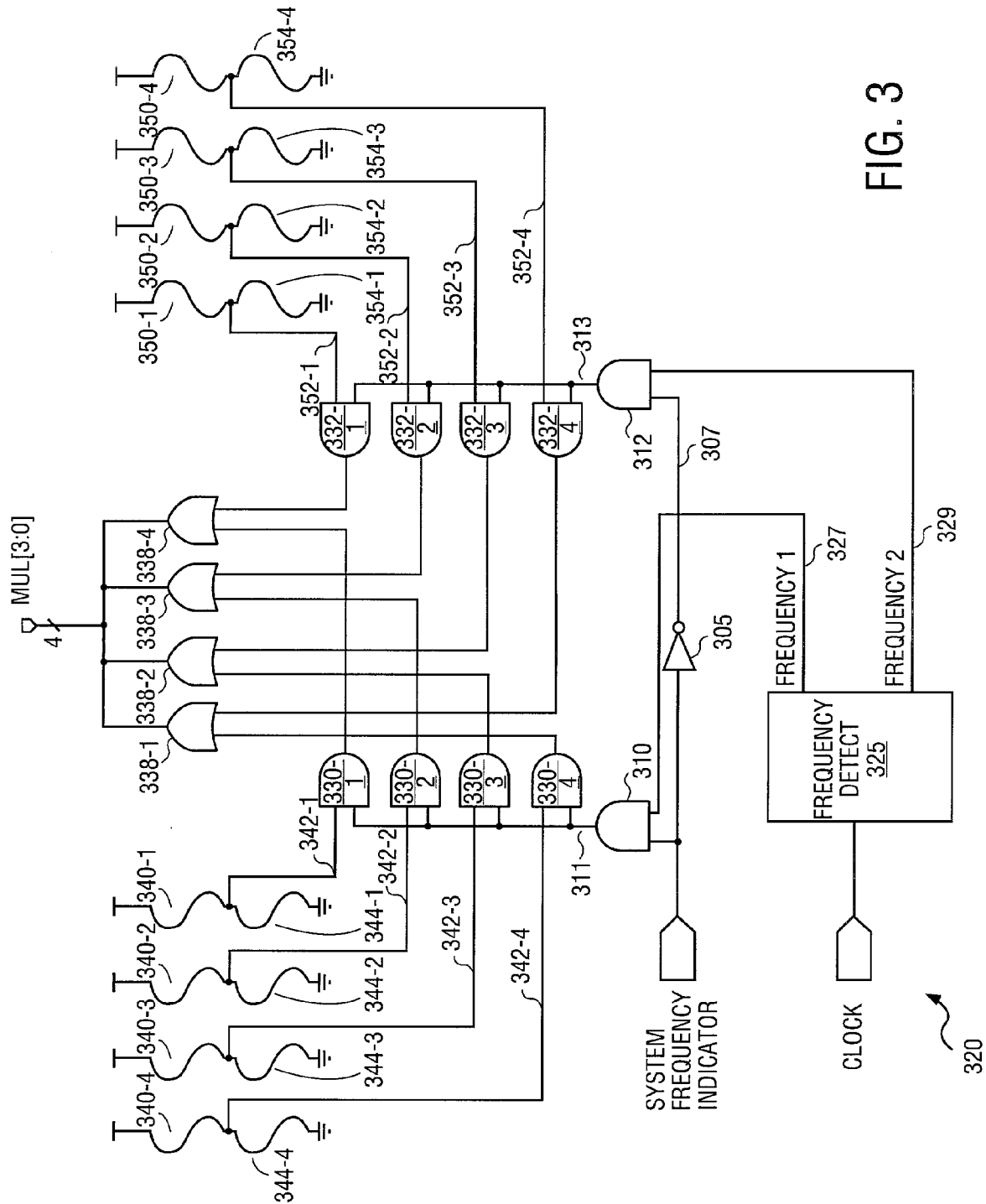
FIG. 3 illustrates another embodiment of clock multiplier selection circuitry.

FIG. 3 illustrates details of one embodiment of a clock multiplier selection circuit 320. The clock multiplier selection circuit 320 of FIG. 3 selects one of two programmed multipliers based on a determination of which of one of two expected frequencies is supplied. Additionally, the clock multiplier selection circuit 320 of FIG. 3 receives a system frequency indicator and may select a clock multiplier if a measured frequency matches the frequency indicated by the system frequency indicator.

In the embodiment of FIG. 3, a frequency detect circuit 325 receives a clock signal and determines whether the clock signal operates at a first frequency or a second frequency. If the frequency detect circuit 325 determines that the frequency of the clock signal is the first frequency, a frequency one signal is asserted (using a logical high value) on a signal line 327. If the frequency detect circuit 325 determines that the frequency of the clock signal is the second frequency, a frequency two signal is asserted (using a logical high value) on a signal line 329.

If the frequency one signal is asserted and the system frequency indicator also indicates frequency one (by a logical high value) then an AND gate 310 outputs a logical high value on a signal line 311. The logical high value on signal line 311 enables AND gates 330-1 through 330-4, thereby allowing the fuse settings for frequency one to be passed through the AND gates 330-1 through 330-4. If the frequency two signal is asserted and the system frequency indicator also indicates frequency two (by a logical low value which is inverted by an inverter 305 to produce a logical high value on a signal line 307) then an AND gate 312 outputs a logical high value on a signal line 313. The logical high value on signal line 313 enables AND gates 332-1 through 332-4, thereby allowing the fuse settings for frequency two to be passed through the AND gates 332-1 through 332-4.

The multiplier in this embodiment is a four bit multiplier MUL[3:0]. MUL[3:0] is output from OR gates 338-1 through 338-4, which supply the fuse values for either frequency one or frequency two, depending on which set of AND gates 330 or 332 are enabled.

The fuse settings for frequency one and frequency two may be programmed by the manufacturer to achieve a desired operating frequency as previously discussed. In one embodiment one fuse or the other must be blown for each bit. In other embodiments, default values may be selected if fuses are not blown. Either a fuse to a supply voltage or a fuse to a ground voltage may be blown for each bit of the clock multiplier in order to select the logical value for that bit. For example, fuses 340-1 through 340-4 may be blown for any bit of the clock multiplier for frequency one that is to be a logical low value. For each bit that is to be a logical low value, a respective one of fuses 344-1 through 344-4 is left intact (not blown). Conversely, for bits of the clock multiplier for frequency one that are to be a logical high level, the appropriate one of fuses 340-1 through 340-4 are not blown and the respective ones of fuses 344-1 through 344-4 are blown. Accordingly, a multiplier value is provided by the fuses on signal lines 342-1 through 342-4. This multiplier setting is passed through AND gates 330-1 through 330-4 if frequency one is indicated by the frequency detect circuit and the system frequency indicator.

The clock multiplier for frequency two is similarly selected. Fuses 350-1 through 350-4 may be blown for any bit of the clock multiplier for frequency two that is to be a logical low value. For each bit that is to be a logical low value, a respective one of fuses 354-1 through 354-4 is left intact (not blown). Conversely, for bits of the clock multiplier for frequency two that are to be a logical high level, the appropriate one of fuses 350-1 through 350-4 are not blown and the respective ones of fuses 354-1 through 354-4 are blown. Accordingly, a multiplier value is provided by the fuses on signal lines 352-1 through 352-4. This multiplier setting is passed through AND gates 332-1 through 332-4 if frequency two is indicated by the frequency detect circuit and the system frequency indicator.

Figure 4:
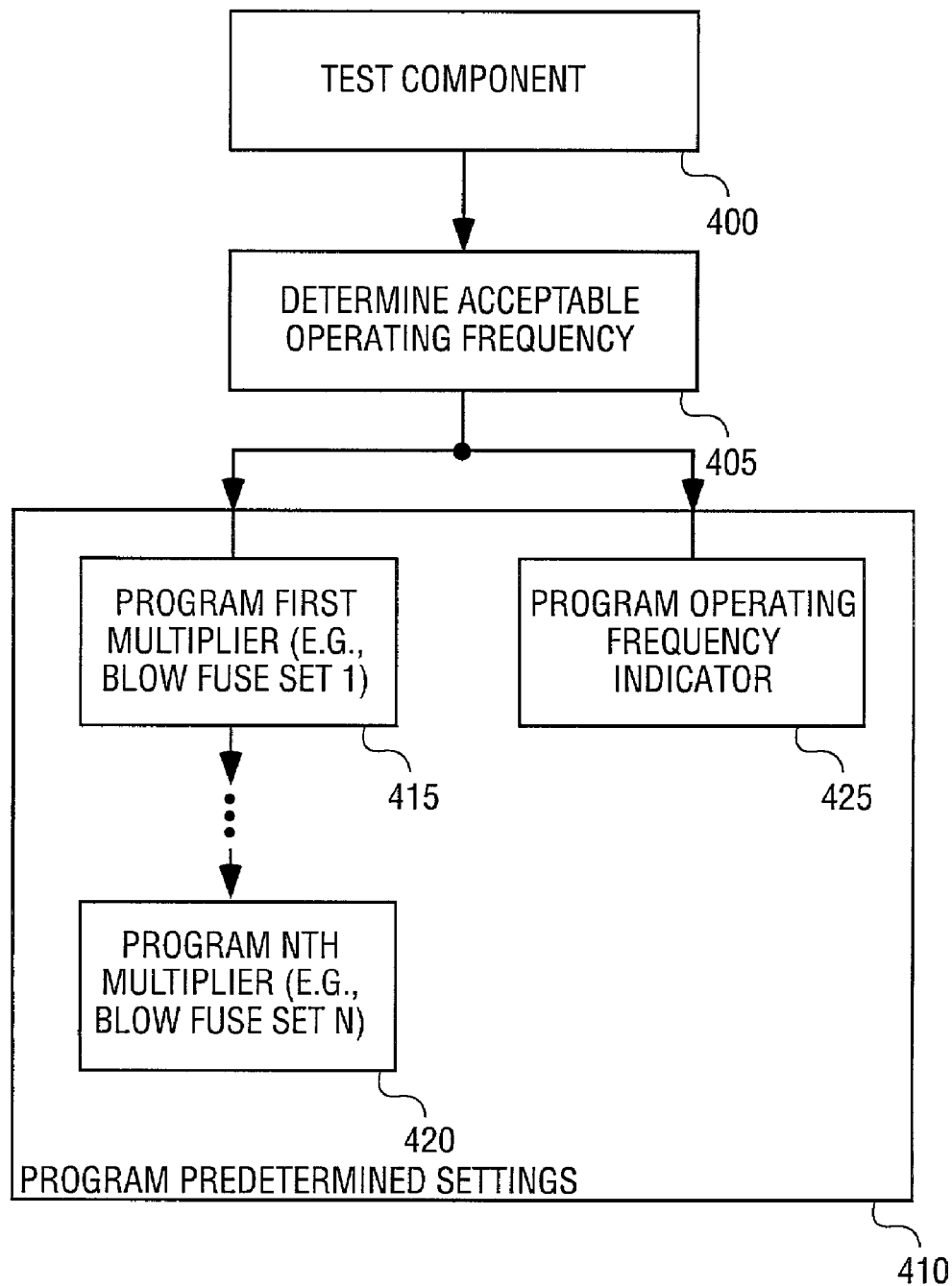
FIG. 4 illustrates various embodiments of methods to program predetermined values to obtain an acceptable operating frequency and/or clock multiplier for a clock multiplied portion of a component.

FIG. 4 illustrates various embodiments of methods to program predetermined values to obtain an acceptable operating frequency and/or clock multiplier for a clock multiplied portion of a component. In block 400, the component is tested. Such testing is well known in understood by those of skill in the art and no particular unique testing is necessary for some embodiments. Standard testing procedures typically result in a determination of a maximum operating frequency for a component. Thus, as indicated in block 405 an acceptable operating frequency is determined. The acceptable operating frequency in many cases may be a maximum operating frequency at which the manufacturer is willing to warrant operation of the component. In other cases, other factors such as heat dissipation, power consumption, or other operating characteristics or concerns may determined a desirable operating frequency other than a maximum possible operating frequency. How the desired operating frequency is selected is not crucial.

In block 410, predetermined settings are programmed in one of two manners, depending on the particular embodiments used. Various embodiments may employ the techniques illustrated in blocks 415 and 420. For example, the hardware embodiments in FIGS. 1 and 3 may use this generalized technique. In block 415, a first multiplier is programmed, corresponding to a first one of the set of N possible received clock frequencies. For example, a set of fuses may be programmed to indicate the multiplier as indicated with respect to FIG. 3. Many other known or otherwise available static programming techniques may be used. Fewer or more fuses could be used in alternative fuse arrangements. Non-volatile memory cells (e.g., Flash memory) could also be used to program the multiplier. The multiplier is programmed to deliver the desired operating frequency or at least approximately the desired operating frequency if a first received clock frequency is detected when the part operates. Similarly, N different multiplier settings are programmed for the N different frequencies that the frequency detect circuit is capable of resolving in this embodiment.

Alternatively, as indicated in block 425, an operating frequency indicator may be programmed. One embodiment that may employ this technique is discussed with respect to FIG. 2. That is, the desired operating frequency may be programmed into a frequency programming circuit and later during component operation a multiplier calculation circuit will perform calculations to determine an acceptable clock multiplier based on a measured clock frequency.

Figure 5:
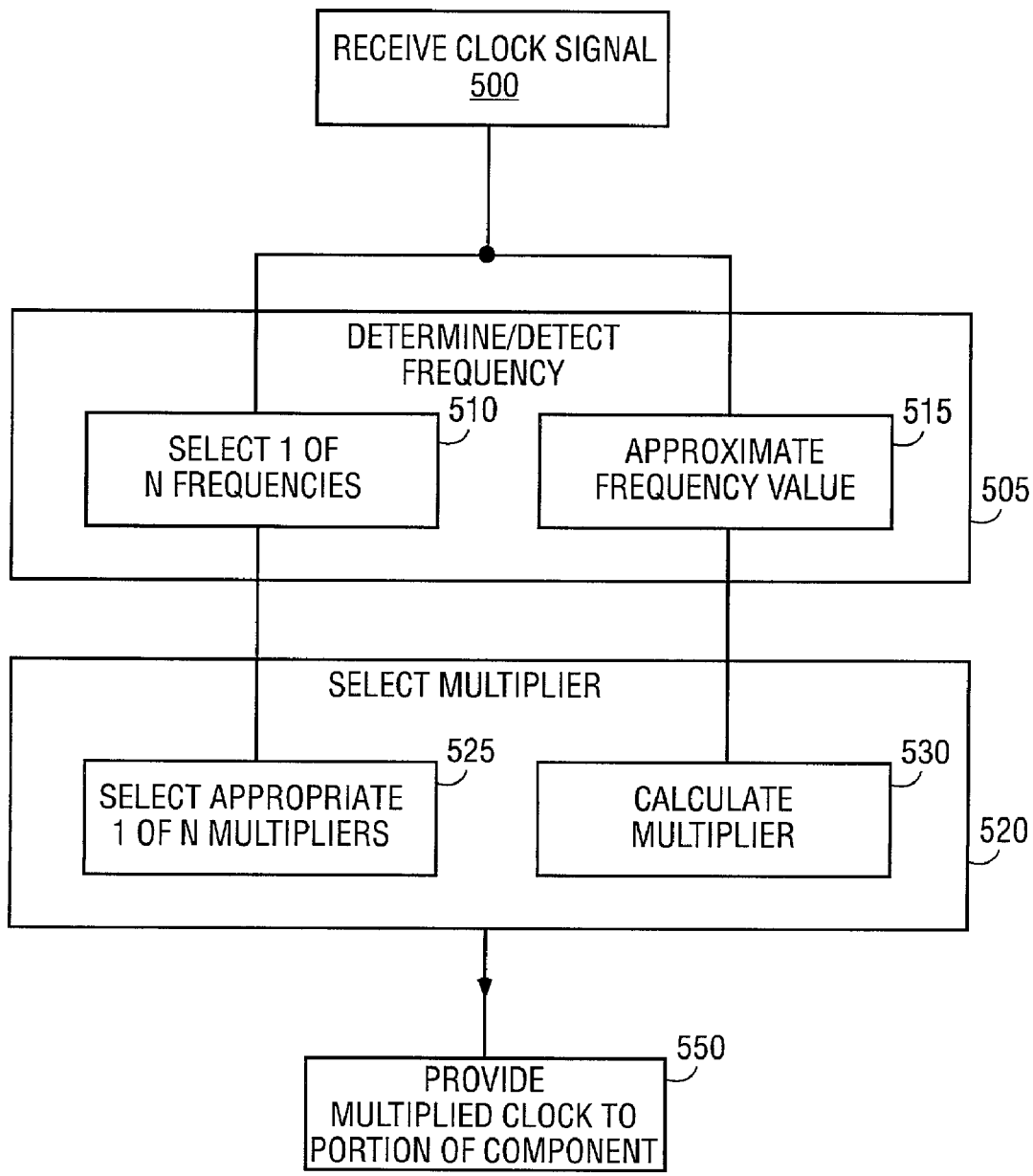
FIG. 5 illustrates various embodiments of methods to determine an appropriate multiplier and provide a multiplied clock to a high frequency portion of a component.

FIG. 5 illustrates various embodiments of methods to determine an appropriate multiplier and provide a multiplied clock to a high frequency portion of a component. These techniques may be employed after the component has been tested and the appropriate programming as discussed with respect to FIG. 4 completed. In block 500, the component receives a clock signal. From that received clock signal a measured clock frequency is determined or detected as indicated in block 505. In one embodiment, one of N frequencies is selected as indicated in block 510. This type of determination may be performed by embodiments including ones such as those illustrated in FIGS. 1 and 3. In block 515, the frequency is determined using more elaborate techniques which develop a digital approximation of the frequency value.

In block 520, the multiplier is selected. From block 510, an appropriate one of N multipliers is selected as indicated in block 525. From block 515, an appropriate clock multiplier is calculated as indicated in block 530 to achieve the desired operating frequency previously programmed. In either case, the multiplier is selected, and a multiplied clock is provided to a clock multiplied portion of the component as indicated in block 550.

Figure 6:
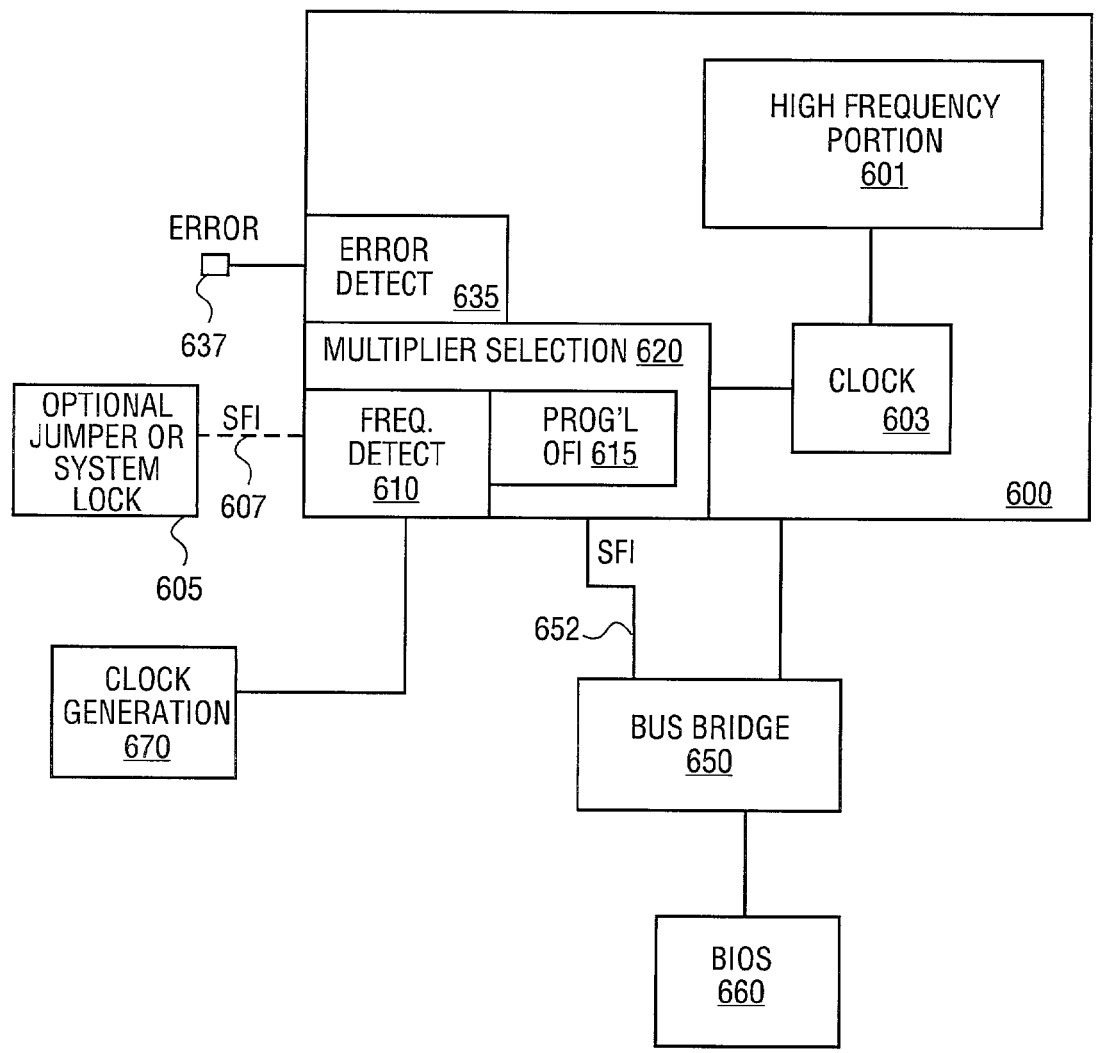
FIG. 6 illustrates one embodiment of a system having a system frequency indicator and clock multiplier selection circuitry to provide a clock multiplier that may be a function of both a received clock frequency and the system frequency indicator.

FIG. 6 illustrates one embodiment of a system that employs a system frequency indicator and clock multiplier selection circuitry that provides a clock multiplier for a processor 600 that may be a function of both a received clock frequency and the system frequency indicator. In the embodiment of FIG. 6, the processor 600 includes a high frequency portion 601, a clock circuit 603, a multiplier selection circuit 620, and an error detect circuit 635. The system includes a bus bridge 650 coupled to the processor 600, a basic input/output system (BIOS) 660, a clock generation circuit 670 and may include optional jumper or system logic 605.

The system frequency indicator (SFI) may be provided to the processor 600 by either the bus bridge 650 over signal line(s) 652 or by a jumper or other system logic using signal line(s) 607. Known general-purpose output techniques, jumper techniques or other system logic implementation techniques may be employed to provide some indication of the frequency expected to be used by the system. Additionally, the BIOS 660 may set the system frequency indicator by appropriately setting a general purpose output in the bus bridge. Many other known or otherwise available techniques may be used for the system designer to supply the processor 600 with a signal to indicate the frequency at which the system manufacturer originally intended the system to operate.

The processor 600 includes frequency detect logic 610 and a programmable operating frequency interface (OFI) 615. The programmable operating frequency interface 615 allows either clock multipliers or an operating frequency for the processor 600 to be programmed as discussed previously with respect to other embodiments.

Figure 7:
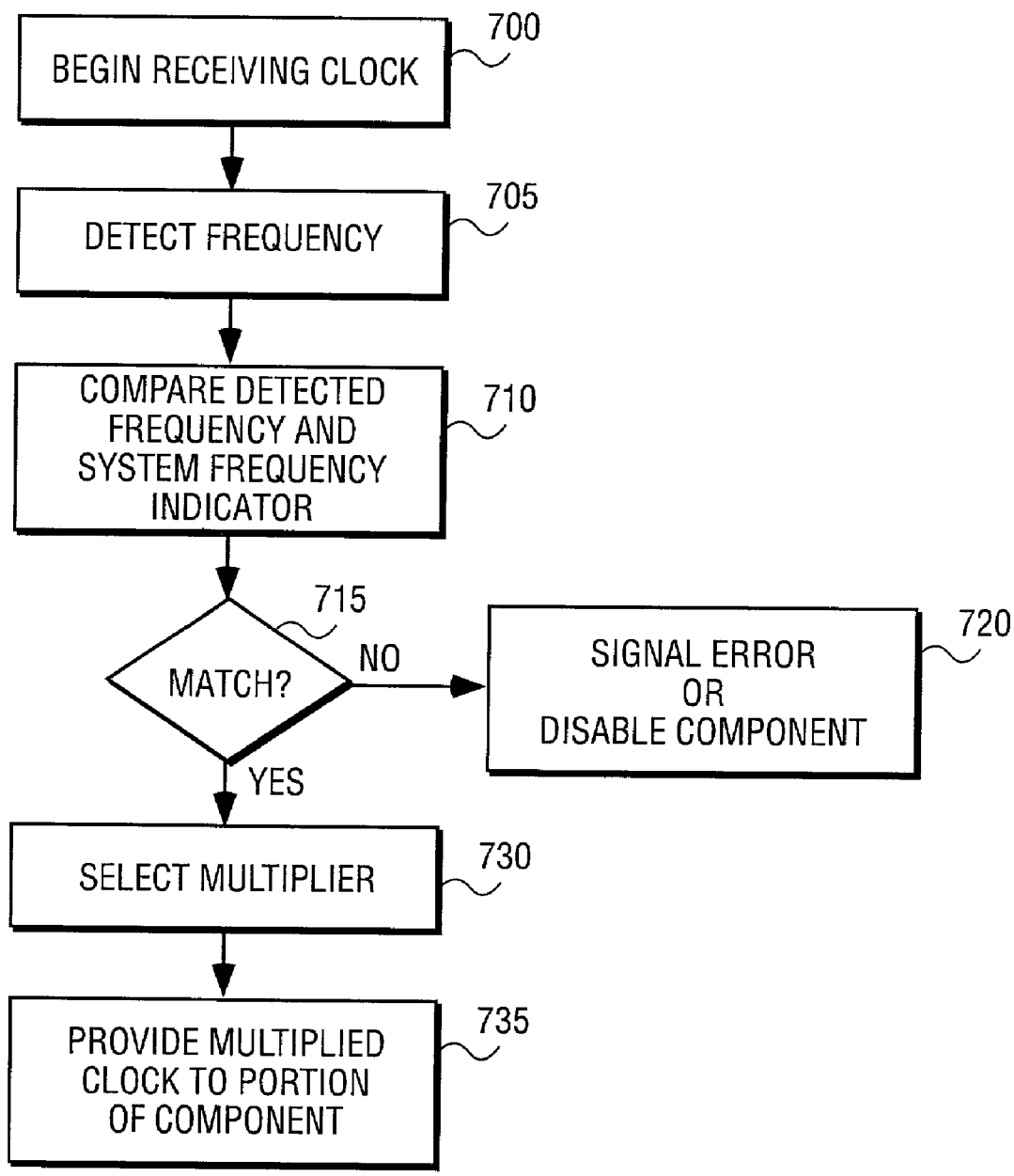
FIG. 7 illustrates one embodiment of a method of selecting a clock multiplier that is a function of both a received clock frequency and the system frequency indicator.

Operation of one embodiment of the system of FIG. 6 is illustrated in FIG. 7. In block 700, the processor 600 begins receiving a received clock signal. The frequency detect circuit 610 detects the frequency of the received clock signal as indicated in block 705. The multiplier selection circuit 620 compares the detected frequency and the system frequency indicator as indicated in block 710. If there is a match in block 715, a multiplier is selected as indicated in block 730. The multiplier selection circuit selects the multiplier to most closely achieve the desired frequency based on inputs from the frequency detect circuit 610 and the programmable operating frequency interface 615. A multiplied clock is provided to a portion of the processor 600 as indicated in block 735.

If no match occurs in block 715, the error detect circuit 635 has detected a mismatch between the frequency the system was originally designed to operate at and the frequency at which a user it is attempting to operate the system. Such a discrepancy may occur, for example, when a user replaces or alters the clock generation circuit 670, perhaps in an attempt to over-clock the processor 600. In such case, an error may be signaled on signal line 637, or the processor may be disabled as indicated in block 720. In other embodiments, the error detect circuit 635 may signal an error or disable the processor if an inappropriate frequency (e.g., too high) external clock is provided to the processor, without consideration of any system frequency indicator. Thus, in an embodiment discussed with respect to FIGS. 6 and 7 over-clocking attempts may be advantageously detected and discouraged or stopped by signaling and/or disabling the processor.

Thus, clock multiplier selection for a microprocessor with multiple system bus clocking frequencies is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. An apparatus comprising:
   a clock interface to receive a bus clock signal;
   a frequency detect circuit to determine an operating frequency of the bus clock signal;
   a multiplier selection circuit to select a predetermined bus clock multiplier from one of a first programmed multi-bit fuse setting and a second programmed multi-bit fuse setting based on the determined operating frequency and a device's desired operating frequency, said multiplier selection circuit including a frequency programming circuit coupled to a programming interface, wherein a predetermined multiplier is selected to multiply the operating frequency of the bus clock to set a desired operating frequency of the device without over-clocking the device's operating frequency, and the first programmed multi-bit fuse setting corresponds to a first set of bus clock frequency multipliers for a first frequency and the second programmed multi-bit fuse setting corresponds to a second set of bus clock frequency multipliers for a second frequency.

2. The apparatus of claim 1 wherein said frequency detect circuit determines one of a plurality of predetermined frequencies.

3. The apparatus of claim 2 wherein said multiplier selection circuit comprises:
   a multiplexer having a control input coupled to said frequency detect circuit and which is to output a multiplier value;
   a plurality of predetermined multiplier settings, each predetermined multiplier setting being coupled to an input of said multiplexer.

4. The apparatus of claim 3 wherein said plurality of predetermined multiplier settings comprise fused multiplier settings.

5. The apparatus of claim 1 wherein said multiplier selection circuit comprises a multiplier calculation circuit to compute the clock multiplier as a function of a predetermined target operating frequency and said operating frequency of said clock signal as determined by said frequency detect circuit.

6. The apparatus of claim 5 wherein said predetermined target operating frequency is to be programmed using fusing.

7. The apparatus of claim 1 further comprising:
a system clock frequency indicator interface to receive a system clock frequency indicator;
wherein said multiplier selection circuit is to select said clock multiplier as a function of both the operating frequency of the clock signal and the system clock frequency indicator.

8. A system comprising:
a system clock that operates at a system clock frequency;
system logic to generate a system clock frequency indicator to indicate the system clock frequency;
a frequency detect circuit to determine the system clock frequency;
a multiplier selection circuit to select a predetermined clock multiplier from one of a first programmed multi-bit fuse setting and a second programmed multi-bit fuse setting based on the determined system clock frequency and a system device's desired operating frequency, said multiplier selection circuit including a frequency programming circuit coupled to a programming interface, wherein a predetermined multiplier is selected to multiply the system clock frequency to set a desired operating frequency of the system device without over-clocking the system device's desired operating frequency, and the first programmed multi-bit fuse setting corresponds to a
first set of bus clock frequency multipliers and the second programmed
multi-bit fuse setting corresponds to a second set of bus clock frequency multipliers.

9. The system of claim 8, further comprising:
a system clock frequency indicator interface to receive the system clock frequency indicator;
wherein said multiplier selection circuit is to select said clock multiplier as a function of both the system clock frequency and the system clock frequency indicator.

10. The system of claim 8, wherein said multiplier selection circuit comprises:
a multiplexer controlled by said frequency detect circuit and which is to output a multiplier value;
a plurality of predetermined multiplier settings, each predetermined multiplier setting being coupled to an input of said multiplexer.

11. The system of claim 10, wherein said multiplier selection circuit is to select said clock multiplier as a function of both the system clock frequency and the system clock frequency indicator by using a first selected clock multiplier if said system clock frequency indicator agrees with a measured clock frequency or else by preventing said first selected clock multiplier from being used if said system clock frequency indicator disagrees with said measured clock frequency.

12. An electronic component comprising:
a clock input to receive a clock operating at a clock frequency;
a clock multiplied portion that operates at an operating frequency that is a multiple of said clock frequency;
a multiplier selection circuit to select one of a plurality of predetermined fixed multipliers from one of a first programmed multi-bit fuse setting and a second programmed multi-bit fuse setting to approximate the clock multiplied portion's operating frequency based on the clock frequency received, said multiplier selection circuit including a frequency programming circuit coupled to a programming interface, wherein the result of the predetermined multiplier multiplying the received clock frequency one of equals the multiplied portion's operating frequency and approximates the multiplied portion's operating frequency to set the multiplied portion's operating frequency without exceeding the multiplied portion's operating frequency, and the first programmed multi-bit fuse setting corresponds to a first set of bus clock frequency multipliers and the second programmed multi-bit fuse setting corresponds to a second set of bus clock frequency multipliers.

13. The electronic component of claim 12 further comprising:
a bus interface portion to operate at the clock frequency.

14. The electronic component of claim 12 further comprising:
a multiplier programming circuit to program a plurality of multipliers selectable by said multiplier selection circuit depending on the clock frequency that is received.

15. The electronic component of claim 14 wherein said multiplier programming circuit comprises a plurality of fuses.

16. A method comprising:
determining a received clock frequency;
selecting a predetermined clock multiplier as a function of said received clock frequency from one of a first programmed multi-bit fuse setting and a second programmed multi-bit fuse setting,
wherein said selecting is based on the determined clock frequency and a device's desired operating frequency, wherein a predetermined clock multiplier is selected from a plurality of preprogrammed multiplier values to multiply the determined clock frequency to set a desired operating frequency for the device without over-clocking the device's desired operating frequency, and the first programmed multi-bit fuse setting corresponds to a first set of bus clock frequency multipliers and the second programmed multi-bit fuse setting corresponds to a second set of bus clock frequency multipliers.

17. The method of claim 16 wherein selecting comprises:
selecting a first clock multiplier if the received clock frequency is approximately a first clock frequency;
selecting a second clock multiplier if the received clock frequency is approximately a second clock frequency.

18. The method of claim 16 wherein selecting comprises:
selecting a first clock multiplier if the received clock frequency is approximately a first clock frequency;
otherwise selecting a second clock multiplier.

19. The method of claim 16 further comprising:
receiving a system clock indicator signal;
wherein said selecting said clock multiplier comprises selecting the clock multiplier as a function of both the system clock indicator signal and the received clock frequency.

20. The method of claim 19 wherein selecting the clock multiplier comprises:
- selecting a first clock multiplier if said received clock frequency is a first frequency and said system clock indicator signal indicates the first frequency;
- selecting a second clock multiplier if said received frequency is a second frequency and said system clock indicator signal indicates the second frequency;
- disabling a component if the system clock indicator signal and the received clock frequency indicate different frequencies.

21. The method of claim 19 wherein selecting said clock multiplier comprises:
- signaling an error if said system clock indicator signal indicates a different frequency than a measured clock frequency.

22. The method of claim 19 wherein selecting said clock multiplier comprises:
- disabling a component if said system clock indicator signal indicates a different frequency than a measured clock frequency.

23. A microprocessor comprising:
- a clock interface to receive an external clock signal having an external clock signal frequency;
- a clock circuit to receive said external clock signal and to generate therefrom an internal clock signal that operates at an internal clock signal frequency which is a multiple of the external clock signal frequency;
- a clock multiplied portion to operate at the internal clock signal frequency;
- a clock multiplier selection circuit to select one of a predetermined plurality of N programmed clock multipliers from one of a first programmed multi-bit fuse setting and a second programmed multi-bit fuse setting as the multiple depending on the external clock signal frequency, said clock multiplier selection circuit including a frequency programming circuit coupled to a programming interface,
- wherein the selected predetermined clock multiplier is selected based on the received external clock signal frequency and the internal clock signal frequency, wherein the multiplier to multiply the external clock signal frequency to set a desired internal clock frequency where the resulting clock frequency does not exceed the internal clock signal frequency, and the first programmed multi-bit fuse setting corresponds to a first set of bus clock f frequency multipliers and the second programmed multi-bit fuse setting corresponds to a second set of bus clock frequency multipliers.

24. The microprocessor of claim 23 further comprising an error detection circuit to signal if the external clock signal frequency is inappropriate.

* * * * *

UNITED STATES PATENT AND TRADEMARK OFFICE
CERTIFICATE OF CORRECTION

PATENT NO. : 7,089,441 B2  Page 1 of 1
APPLICATION NO. : 09/795733
DATED : August 8, 2006
INVENTOR(S) : Goodrich, III et al.

It is certified that error appears in the above-identified patent and that said Letters Patent is hereby corrected as shown below:

In column 12, at line 20, delete "f".

Signed and Sealed this

Sixth Day of November, 2007

JON W. DUDAS
*Director of the United States Patent and Trademark Office*